United States Patent [19]
Kunkel et al.

[11] Patent Number: 5,026,469
[45] Date of Patent: Jun. 25, 1991

[54] APPARATUS FOR HOLDING AND TURNING EYEGLASS LENSES IN A HIGH-VACUUM VAPOR DEPOSITION OR SPUTTERING SYSTEM

[75] Inventors: Georg Kunkel, Heigenbruecken; Dieter Klingenstein, Erlensee; Heinz Mahr, Buedingen; Michael Fliedner, Bruchkoebel, all of Fed. Rep. of Germany

[73] Assignee: Leybold Aktiengesellschaft, Fed. Rep. of Germany

[21] Appl. No.: 456,474

[22] Filed: Dec. 26, 1989

[30] Foreign Application Priority Data

Jul. 1, 1989 [DE] Fed. Rep. of Germany ....... 3921672

[51] Int. Cl.$^5$ ................. C23C 14/00; C23C 16/00
[52] U.S. Cl. ................. 204/298.15; 204/298.28; 118/730; 118/731
[58] Field of Search ................. 204/298.15, 298.28; 118/500, 730, 731

[56] References Cited

U.S. PATENT DOCUMENTS

| | | | |
|---|---|---|---|
| 2,410,720 | 11/1946 | Dimmick | 118/730 |
| 3,396,696 | 8/1968 | Becker | 118/731 |
| 3,859,956 | 1/1975 | Paola | 118/720 |
| 4,329,938 | 5/1982 | Mang | 118/730 |
| 4,485,759 | 12/1984 | Brandolf | 118/730 |

FOREIGN PATENT DOCUMENTS

| | | |
|---|---|---|
| 0215261 | 3/1987 | European Pat. Off. . |
| 3715831 | 2/1988 | Fed. Rep. of Germany . |
| 0128724 | 8/1983 | Japan .................................. 118/731 |

*Primary Examiner*—John F. Niebling
*Assistant Examiner*—Steven P. Marquis
*Attorney, Agent, or Firm*—Hill, Van Santen, Steadman & Simpson

[57] ABSTRACT

An apparatus for holding and turning lenses, particularly for eyeglass lenses to be coated in a high-vacuum vapor deposition or sputtering system. A ring pair carrying the lens to be held is seated on a substrate holder in the process chamber of the high-vacuum system. The substrate holder is a sheet metal part shaped like a half shell, and is rotatable about a vertical axis. A sickle shaped sheet metal blank forms a rake that partially overlaps the substrate holder. The rake is held and guided by a guide ring that is displaceable in the direction of the rotational axis of the substrate holder. The rake is displaceable by a lifting element of a lifting motor secured to the wall of the chamber. The rake includes individual tines having lower edges facing toward the substrate carrier. The tines engage pinions or gear wheels on the individual lens holders. The lens holders are mounted to the substrate via pegs, which allow the lens holders to pivot 180°. The lens holders are pivoted by rotating the substrate holder after the lifting mechanism has lowered the rake, thus permitting engagement between the tines of the rake and the gears or pinions.

7 Claims, 5 Drawing Sheets

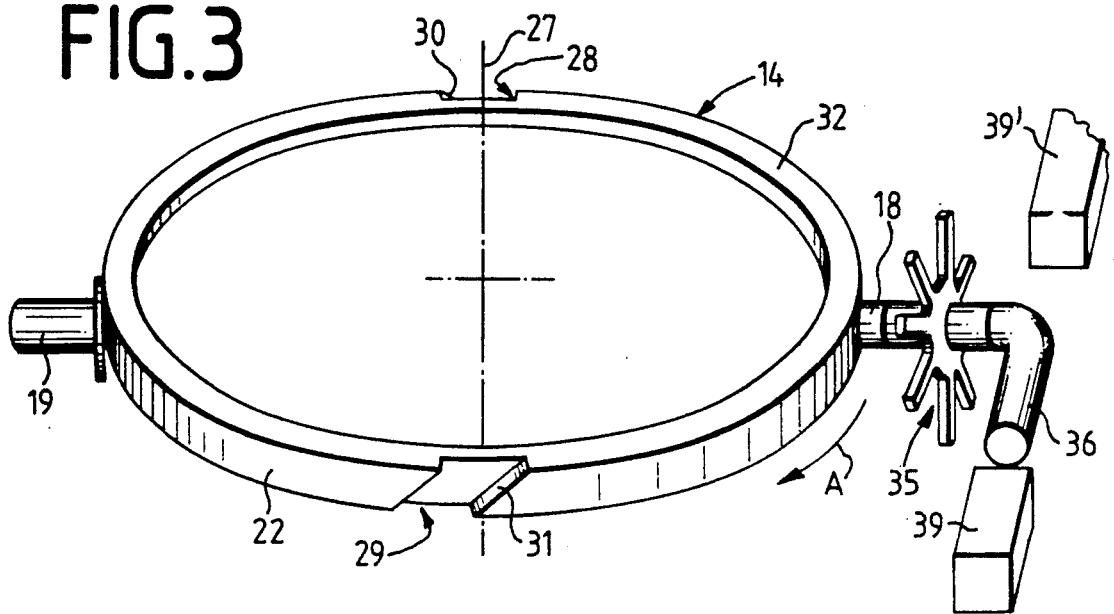
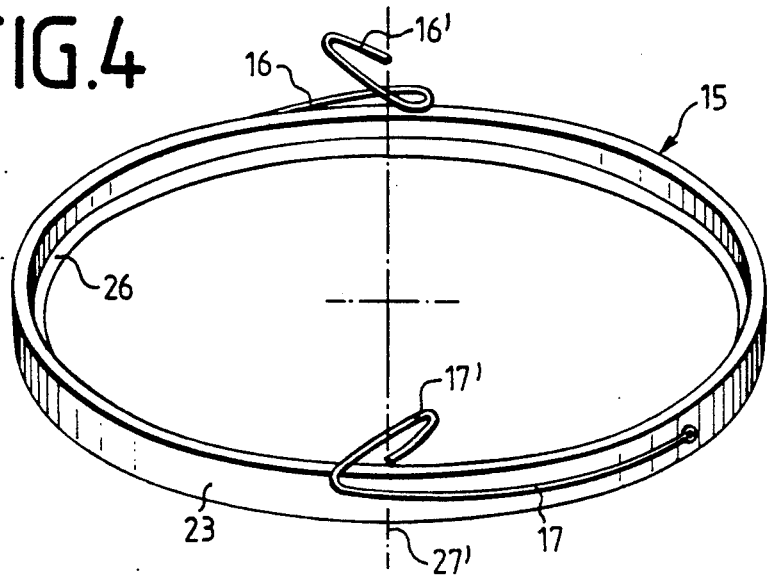
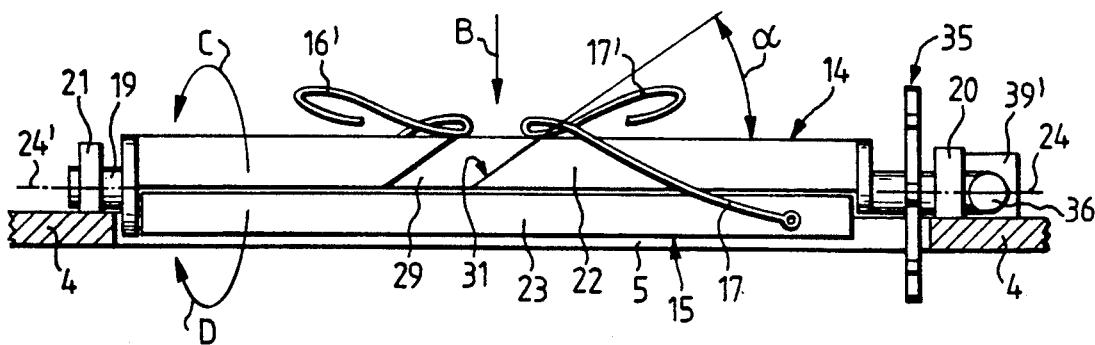

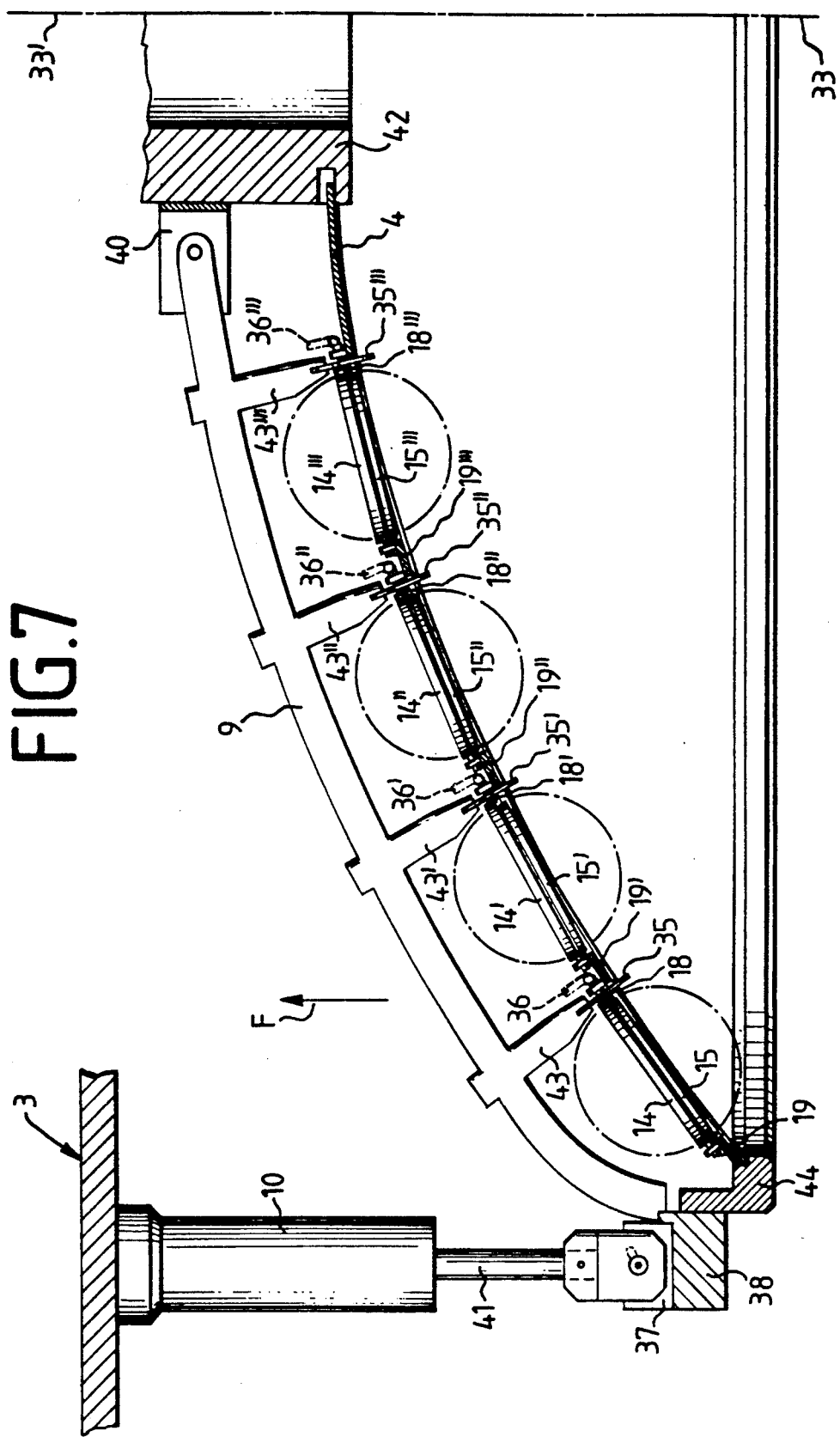

5,026,469

APPARATUS FOR HOLDING AND TURNING EYEGLASS LENSES IN A HIGH-VACUUM VAPOR DEPOSITION OR SPUTTERING SYSTEM

TECHNICAL FIELD

The invention is directed to an apparatus for holding and turning eyeglass lenses, the apparatus being connectable to a substrate holder that is held in the process chamber of a high-vacuum vapor deposition or sputtering system.

BACKGROUND OF THE INVENTION

German OS 37 15 831 shows a vacuum coating system for vapor deposition of anti-reflection coating layers on optical substrates such as lenses for plastic eyeglasses. The lenses can be clamped on a carrier that rotates in an evacuatable chamber above a vaporization source. The carrier is formed by a plurality of planar carrier plates which are arranged and supported to approximate a portion of a sphere, each of which is capable of at least 180° of rotation relative to the other plates. Every carrier plate includes a plurality of openings in which are mounted substrate holders including at least one retaining spring. The substrate holders are freely tiltable, from both sides, out of the plane of the carrier plate up to a predetermined angle. Thus, every substrate holder includes a resilient and freely tiltable mount secured to the carrier plate.

European Patent No. 215 261 teaches a lens holder for eyeglass lenses to be cleaned and subsequently coated. The lens holder is fashioned as a ring having an interior surface from which extends a plurality of notched projections which accept the lenses to be held. The ring is elastically deformable, and the notched projections are arranged generally opposite one another.

SUMMARY OF THE INVENTION

It is therefore an object of the present invention to provide an apparatus for holding and turning lenses that is suitable for a substrate carrier shaped like a spherical shell or screen, and having a plurality of lenses arranged thereupon. The apparatus facilitates fast turning of the lenses relative to the coating source. The surface of the lens facing toward the source has the same spacing from, and position relative to, the coating source regardless of which way the lens is turned.

This and other objects are inventively achieved by providing a sickle-shaped sheet metal blank or profile element that forms a slide or rake. The rake at least partially overlaps the sheet metal half-shell that forms the substrate holder. The edge of the rake facing toward the substrate holder is held at a slight distance from the outside surface of the substrate holder by a sliding block or articulated arm arranged in the process chamber. The articulated arm allows the rake to be moved around the rotational axis of the substrate holder, relative to the upper side of the substrate holder.

In a preferred embodiment, the substrate holder is rotatable around a vertical axis, and is at least partially overlapped by the rake. The rake is in turn held and guided by an articulated arm, a sliding block, or bush that is displaceable along the rotational axis of the substrate holder. Further guidance of the rake is provided by a lifting element of a lifting mechanism, for example a lifting motor, that is secured to the wall of the process chamber. The rake includes individual tines having lower edges facing toward the substrate carrier. The tines are selectively engageable with pinions or gear wheels associated with individual lens holders. The tines engage the pinions or gear wheels to turn the lenses by approximately 180°.

Preferably, the rake includes a plurality of tines that extend approximately perpendicularly relative to the outside surface of the substrate carrier, and into the immediate vicinity of the pinions or gear wheels of the respective lens holders.

In a preferred embodiment, one end of the rake extends generally transversely relative to the rotational axis of the substrate carrier, and is hinged to a lifter ring. The other end of the rake is connected to a coupling ring that abuts the substrate carrier. The coupling ring extends generally transversely relative to the rotational axis of the substrate carrier, and is connected to the wall of the process chamber via a lifter element. In this embodiment, the lifter element includes a piston rod of a lifting motor, and is movable by the lifting motor along the rotational axis of the substrate carrier.

In an alternative embodiment, the tines are movably hinged to the rake so that they are upwardly displaceable. Such hinging allows the tines to yield upwardly toward the rake when the tines come into contact with a blocked pinion or gear wheel.

In order to insure uniform swiveling of the lens holders, the tines hinged to the rake are formed as fork-like or comb-like tooth segments. The tooth segments effect swiveling of the lens holder when they engage the pinion or gear wheel.

Other objects and advantages of the present invention will become apparent upon reference to the accompanying description when taken in conjunction with the following drawings.

BRIEF DESCRIPTION OF THE DRAWINGS

FIGS. 3 and 4 are schematic perspective views showing respective rings forming a lens holder.

FIG. 5 is a side sectional view of the rings of FIGS. 3 and 4 assembled together.

FIG. 7 is a side-sectional view of a rake and substrate holder partially broken away.

DETAILED DESCRIPTION OF THE PREFERRED EMBODIMENTS

Figure 1:
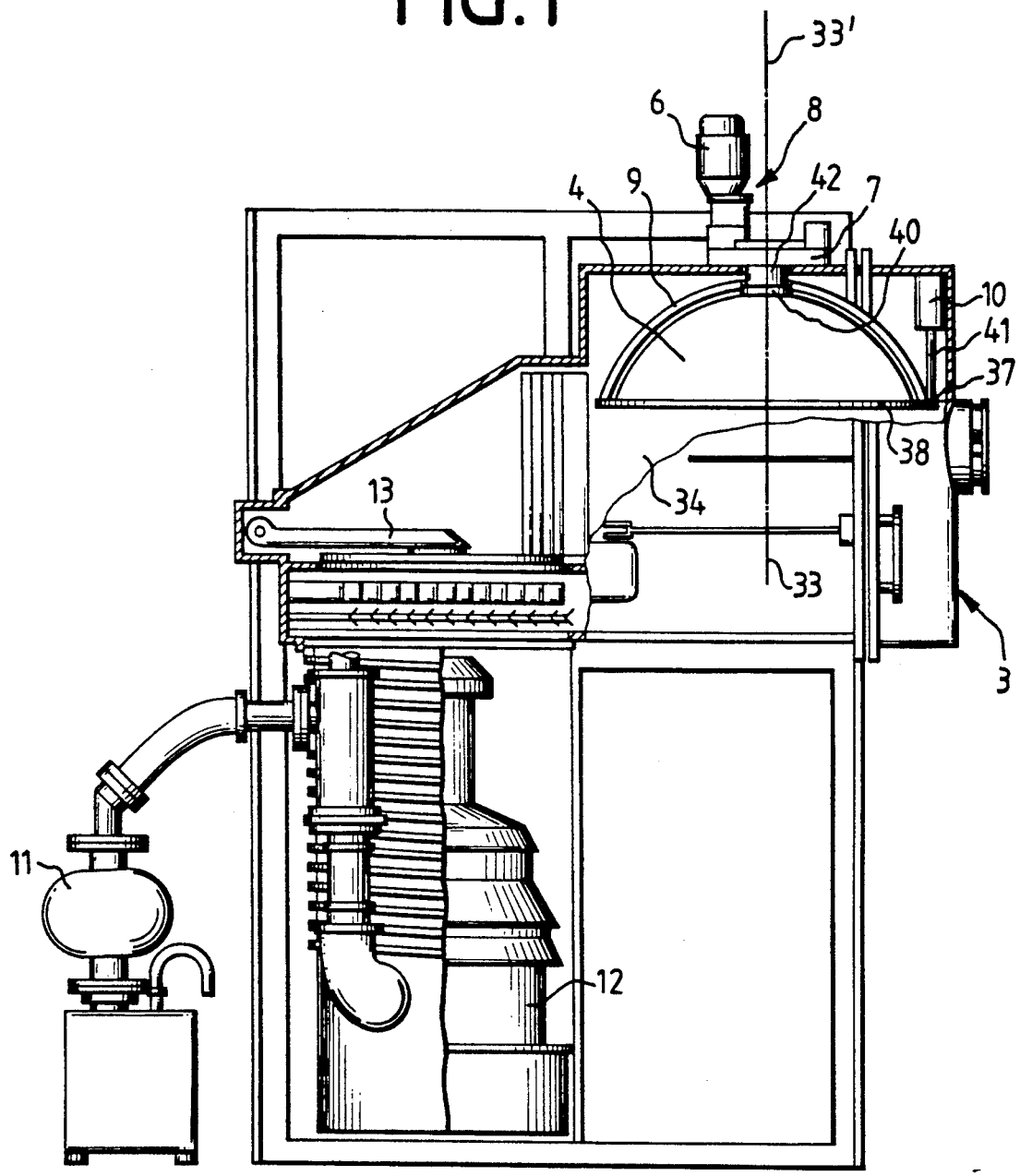
FIG. 1 is a part-sectional view of a high-vacuum vapor deposition system in which the present invention is employed.
Figure 2:
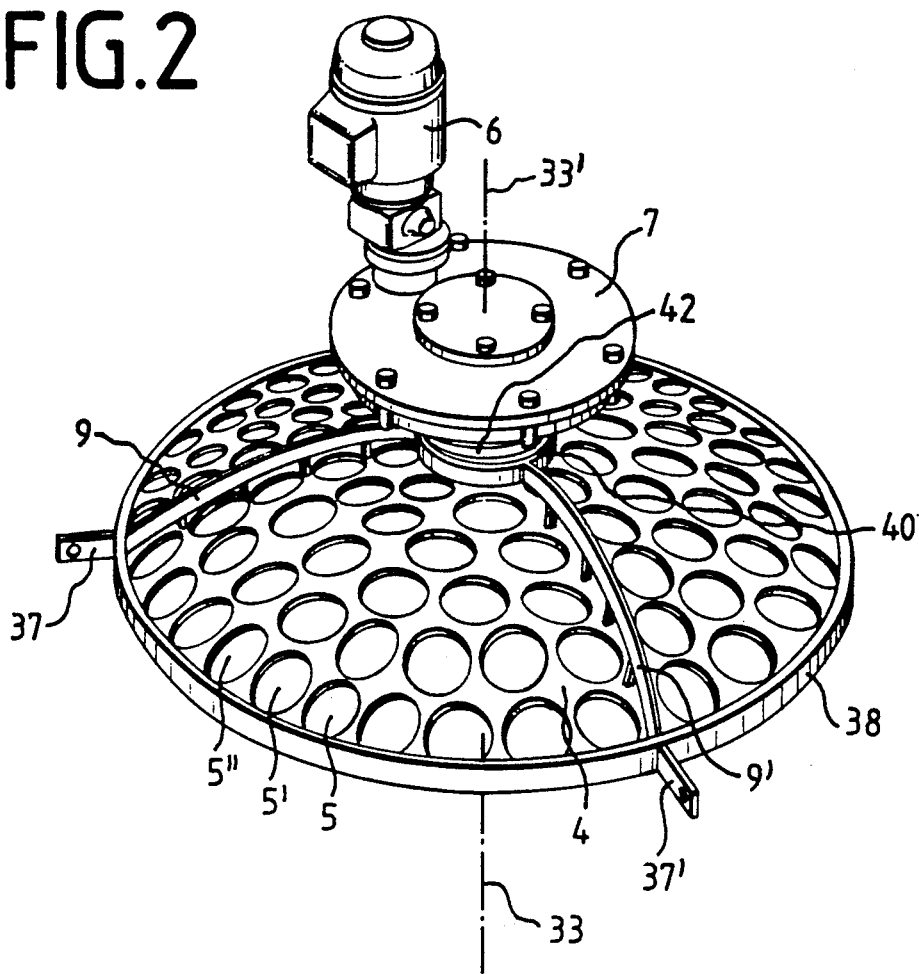
FIG. 2 is a perspective view of a part spherical substrate carrier.

FIGS. 1 and 2 show the general environment in which the present invention operates.

The high-vacuum vapor deposition system shown in FIG. 1 includes a housing 3 including a process chamber 34 having a vaporization source arranged therein. Also in the chamber 34 is a part spherical substrate holder 4. The substrate holder 4 is rotatable around a vertical axis, and includes a drive unit 8 including a motor 6 having gearing 7, and a slide or rake 9 having a lifting motor 10. The vapor deposition system also includes a backing pump unit 11, a diffusion pump 12 and a vacuum valve 13.

Part of the substrate holder 4 includes a sheet metal blank provided with a plurality of openings 5, 5', best seen in FIG. 2.

The openings 5' in the substrate holder 4 serve the purpose of receiving ring pairs 14, 15, as shown in detail in FIGS. 3 through 5. The ring pairs 14, 15 are connected to one another with wire springs 16, 17 and include pegs 18, 19 that can be inserted into bearing forks 20, 21 located on the surface of the substrate holder 4 near the edges of the openings 5, 5'. In the embodiment shown in FIGS. 3 and 5, two pegs 18, 19 lie diametrically opposite one another on the outside surface 22 of the ring 15. The pegs 18, 19 are mounted such that the rotational axis 24, 24' of the lens holder lies roughly in the contacting plane of the rings 14, 15.

The ring 14 has an outer surface 22 into which extend two diametrically opposite channels 28, 29. The channels 28, 29 include inclined ramp surfaces 30, 31 that lie at approximately a 30° angle to a circumferential plane passing through an upper side 32 of the ring 14.

Figure 6:
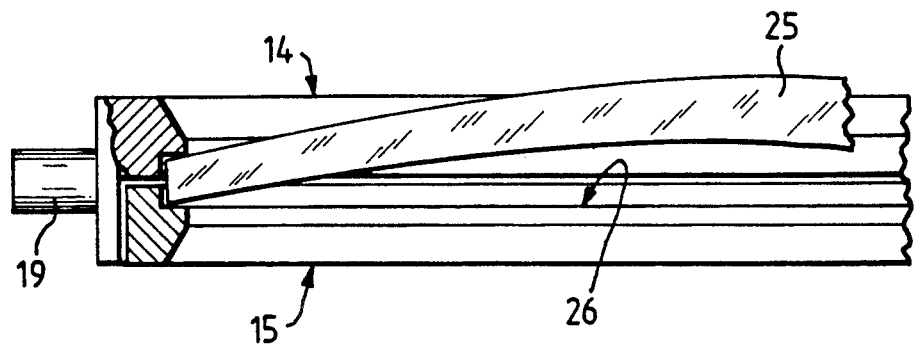
FIG. 6 is a sectional detail, partly broken away, showing a lens mounted between two rings.

The ring 15 includes a pair of wire springs 16, 17 extending from an outer surface 23 thereof. The wire springs 16, 17 include respective resilient ends 16', 17' in the form of a loop or bight that are disposed at an angle approximately corresponding to that of the channels 28, 29. The ring 15 further includes a flanged step 26 that is capable of receiving an eyeglass lens 25 (FIG. 6).

In order to place the eyeglass lens 25 into the rings 14, 15 and subsequently join the rings 14, 15 to one another, the eyeglass lens 25 is placed on the flanged step 26 of the ring 15. The ring 14 is then placed onto the ring 15 from above, such that the transverse axes 27, 27' of the rings 14, 15 are aligned. Next, the ring 14 is turned relative to the ring 15 in the direction of arrow A (FIG. 3) until the ends 16', 17' of the wire springs 16, 17 slide into the channels 28, 29. With continued turning, the ends 16', 17' slide along the ramps 30, 31 until they lie on the upper surface 32 of the first ring 14. In this position, the resiliency of the wire springs 16, 17 retains the two rings 14, 15 together with the eyeglass lens 25 lying therebetween.

Having been clipped together, the two rings 14, 15 are positioned in the direction of arrow B (FIG. 5) so that they are situated in the fork shaped or U-shaped bearing forks 20, 21. The outside diameter of the rings 14, 15 and the inside diameter of the openings 5, 5' are selected such that the ring pair 14, 15 can be turned in the direction of arrows C or D around the rotational axis 24, 24'.

The turning or swiveling motion of the ring pairs 14, 15 may be accomplished with the assistance of a rake 9 in the housing 3 when the process chamber 34 is closed. The rake 9 is formed as a semi-circular sheet metal blank. When the substrate holder 4 rotates about the axis 33, 33', the rake 9 sweeps over the upper side of the substrate holder 4. The tines of the rake 9 come into contact with teeth of a gear wheel 35 arranged on the peg 18 of the ring 14. The rake remains in contact with the gear wheel 35 until the ring pair 14, 15 has turned 180° around the axis 24, 24'. The peg 18 includes a finger 36 that may be held in position by one of a pair of magnets 39, 39' arranged on the upper side of the substrate holder 4. The magnets 39, 39' ensure that the ring pair 14, 15 does not remain in an unstable intermediate position, and prevents the ring pair 14, 15 from unwanted rotary motion.

The interaction of the rake 9 with the gear wheels 35 effects a swivel motion of the respective ring pairs 14, 15, thus allowing the eyeglass lenses 25 to be turned during the coating process when the chamber 34 is closed. Selective actuation of the rake 9 or plurality of rakes 9, 9' is provided by a separate lifting motor 10 having a lifting member 41 and a mounting piece 37. The mounting piece 37 is hinged to a coupling ring 38 that connects a plurality of rakes 9, 9' to one another. The other end of the rakes 9, 9' are connected to one another at a lifter ring 40 that is displaceably held and guided on the bearing tube 42 of the drive unit 8.

When the lifting motors 10 are activated, the rakes 9, 9', together with the coupling ring 38, move in the direction of arrow F out of the lower position shown in FIG. 7 into an upper position in which the individual tines 43, 43' of the rakes 9, 9' disengage from the corresponding gear wheels 35, 35'. With the rakes in this upper position, the substrate carrier 4 can freely rotate. The respective lens holders are retained in their predetermined positions.

The lower edge of the substrate carrier 4 is provided with a reinforcing ring 44. The reinforcing ring 44 forms a guide surface for the coupling ring 38 during movement of the substrate holder in the direction of arrow F. Although three rakes 9 are clamped between lifter ring 40 and coupling ring 38 in the exemplary embodiment, any number may be provided. The coupling ring 38 and reinforcing ring 44 allow the rakes to be lifted simultaneously in the direction of arrow F so that the tines 43, 43' simultaneously disengage from the gear wheels 35, 35'.

Figure 8:
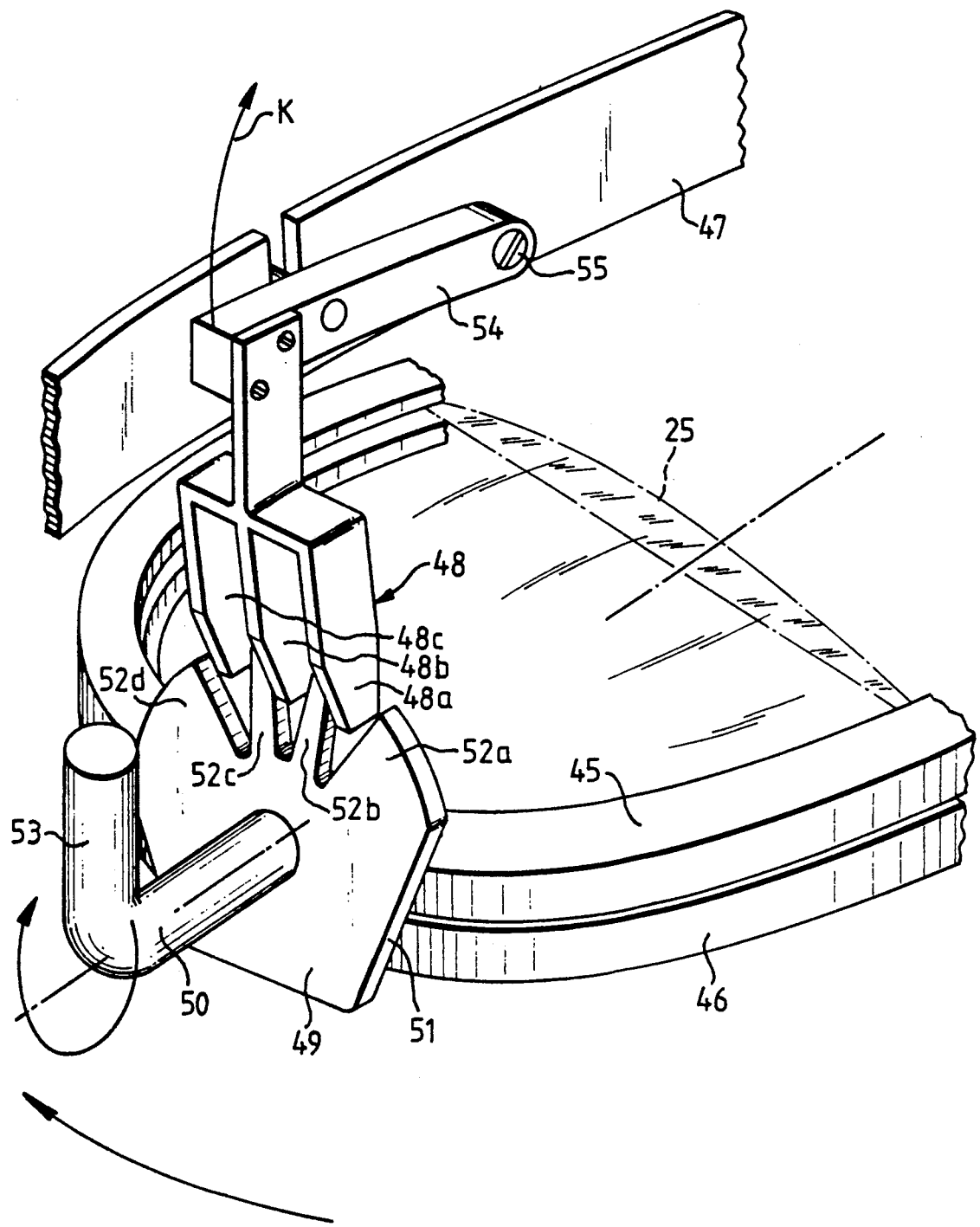
FIG. 8 is a broken-away perspective view of a rake, lens holder, and tine arrangement.

In the embodiment of the apparatus shown in FIG. 8, tines 48 are hinged to the rake 47. The tines are formed as fork-like or comb-like tooth segments, here shown as three tine ends 48A, 48B, and 48C. The tine ends 48A, 48B, and 48C engage a connecting link 49 that is provided with a plurality of teeth 52A, 52B, 52C, and 52D. Each connecting link 49 is also provided with a ramp 51 at each side thereof. The ramps 51 prevent blockage of the apparatus when for example, the lens holder 45, 46 has already rotated in position and can rotate no further due to the engagement of finger 53 with substrate holder 4. In the event that this occurs, the tine 48 travels along and is urged upwardly by the ramp 51. Thus, the tine ends 48A, 48B, and 48C are disengaged from the connecting link 49 in the direction of arrow K. The tine 48 is secured to a pivot arm 54 that is in turn hinged to the rake 47 with a pin 55.

Although the present invention has been described with reference to a specific embodiment, those of skill in the art will recognize that changes may be made thereto without departing from the scope and spirit of the invention as set forth in the appended claims.

We claim:

1. An apparatus for holding and turning eyeglass lenses to be coated in a high-vacuum vapor deposition or sputtering system, said apparatus comprising:
   a half-shell shaped substrate holder adapted for mounting in a process chamber of said high-vacuum system;
   at least one lens holder pivotably connected to said substrate holder;
   at least one sickle-shaped sheet metal rake partially overlapping said substrate holder;
   fork means on said at least one rake actuatable for engaging and pivoting said at least one lens holder;
   means for holding an edge of said rake a slight distance from, and in facing relationship to, an outside surface of said substrate holder; and means for moving said rake around a rotational axis of said substrate holder and actuating said fork means.

2. An apparatus for holding and turning eyeglass lenses to be coated in a high-vacuum vapor deposition or sputtering system, said apparatus including at least one lens holder that is connectable to a substrate holder held in a process chamber of said high-vacuum system in the proximity of a coating source, said apparatus comprising:

pivot means for pivotably mounting said at least one lens holder to said substrate holder;

drive means for rotating said substrate holder about a vertical rotational axis;

a rake assembly including at least one sickle-shaped rake partially overlapping said substrate holder;

lifting means, secured to said process chamber, for vertically displacing said rake assembly along said rotational axis of said substrate holder; and tine means on said at least one rake for selectively engaging said pivot means during rotation of said substrate holder, and for pivoting said at least one lens holder.

3. An apparatus according to claim 2, further wherein:

said pivot means comprises a plurality of gear wheels respectively associated with each lens holder; and said tine means comprises a plurality of tines disposed at discrete positions along said at least one rake.

4. An apparatus according to claim 3 further comprising:

a lifter ring concentric with said rotational axis of said substrate holder and hingedly attached to a first end of said rake assembly;

a coupling ring circumferentially abutting said substrate carrier and disposed transversely relative to said rotational axis of said substrate carrier, said coupling ring being hingedly attached to a second end of said rake assembly; and connecting means attached to said coupling ring for securing said lifting means to said rake assembly.

5. An apparatus according to claim 4, further comprising safety means for permitting said tines to temporarily yield upon engagement with a blocked or rotation inhibited gear wheel.

6. An apparatus according to claim 2, further wherein said tine means have free ends including tooth segment means for engaging said pivot means.

7. An apparatus for holding and turning eyeglass lenses to be coated in a high-vacuum vapor deposition or sputtering system, said apparatus including a plurality of rows of lens holders, each of which includes a plurality of lens holders, each of said lens holders being connectable to a substrate holder held in a process chamber of said high-vacuum system in the proximity of a coating source said apparatus comprising:

selectively actuable pivot means for independently pivotably mounting each of said lens holders on said substrate holder;

rake means for sweeping over an outer surface of said substrate holder to actuate said pivot means; and fork means, disposed on said rake means and corresponding in number to said rows of lens holders, for engaging and pivoting each lens holder in each of said rows of lens holders.

* * * * *